(12) United States Patent
Liu

(10) Patent No.: US 12,382,586 B2
(45) Date of Patent: Aug. 5, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: Bo Liu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 829 days.

(21) Appl. No.: 17/260,164

(22) PCT Filed: Nov. 30, 2020

(86) PCT No.: PCT/CN2020/132610
§ 371 (c)(1),
(2) Date: Jan. 13, 2021

(87) PCT Pub. No.: WO2022/104898
PCT Pub. Date: May 27, 2022

(65) Prior Publication Data
US 2022/0408564 A1 Dec. 22, 2022

(30) Foreign Application Priority Data
Nov. 17, 2020 (CN) .......................... 202011286026.9

(51) Int. Cl.
*H05K 1/18* (2006.01)
*H05K 3/36* (2006.01)

(52) U.S. Cl.
CPC ............. *H05K 1/189* (2013.01); *H05K 3/363* (2013.01); *H05K 2201/10128* (2013.01); *H05K 2201/10303* (2013.01)

(58) Field of Classification Search
CPC .............. G09G 3/3674; G09G 3/3266; G09G 2310/0264; G09G 2310/0275; G09G 2310/0278; G09G 2310/0267; H05K 2201/10128; H05K 1/189; G06F 3/0446;
(Continued)

(56) References Cited

U.S. PATENT DOCUMENTS

| 6,624,868 B1 | 9/2003 | Terukina |
| 2008/0204434 A1 | 8/2008 | Lee et al. |

(Continued)

FOREIGN PATENT DOCUMENTS

| CN | 107167946 A | 9/2017 |
| CN | 107749240 A | 3/2018 |

(Continued)

*Primary Examiner* — William Boddie
*Assistant Examiner* — Alecia D English

(57) ABSTRACT

The present application provides a display panel and a display device, the display panel is provided with two driving chips disposed side by side in a first border of a non-display area, and a flexible circuit board is disposed between the two driving chips. Compared with the prior art, a longitudinal distance between the driving chip and the flexible circuit board on the display panel border can be reduced, so as to reduce a length of the lower border of the display panel and increase a space of a display area.

7 Claims, 4 Drawing Sheets

(58) Field of Classification Search
CPC .... G06F 3/04164; G06F 1/183; G06F 1/1601; G06F 13/20; G06F 13/4068; G06F 3/047
See application file for complete search history.

(56) References Cited

U.S. PATENT DOCUMENTS

| | | | | |
|---|---|---|---|---|
| 2012/0161805 | A1* | 6/2012 | Jung | G09G 3/006 |
| | | | | 324/754.07 |
| 2015/0226995 | A1 | 8/2015 | Aota | |
| 2016/0100486 | A1* | 4/2016 | Chen | H05K 1/189 |
| | | | | 361/783 |
| 2019/0199025 | A1* | 6/2019 | Kim | H01R 12/88 |
| 2020/0103693 | A1* | 4/2020 | Chen | G02F 1/13452 |
| 2020/0124897 | A1 | 4/2020 | Nong | |
| 2020/0201506 | A1* | 6/2020 | Chen | G06F 3/04164 |
| 2021/0005703 | A1* | 1/2021 | Wang | G09G 3/3225 |
| 2022/0189377 | A1* | 6/2022 | Wang | G09G 3/3266 |
| 2022/0272831 | A1* | 8/2022 | Wang | H05K 1/0213 |
| 2023/0052091 | A1* | 2/2023 | Xu | H01L 23/49838 |
| 2023/0080422 | A1* | 3/2023 | Xiao | G02F 1/13452 |
| | | | | 345/55 |
| 2023/0380234 | A1* | 11/2023 | Tian | H05K 1/189 |

FOREIGN PATENT DOCUMENTS

| | | |
|---|---|---|
| CN | 108388054 A | 8/2018 |
| CN | 109994042 A | 7/2019 |
| CN | 110189696 A | 8/2019 |
| CN | 209804149 U | 12/2019 |
| CN | 111273471 A | 6/2020 |
| CN | 111679467 A | 9/2020 |
| CN | 111919164 A | 11/2020 |
| EP | 1962270 A1 | 8/2008 |
| WO | 2020077736 A1 | 4/2020 |

\* cited by examiner

DISPLAY PANEL AND DISPLAY DEVICE

BACKGROUND OF INVENTION

Field of Invention

The present application relates to a field of display technology and in particular to a display panel and display device.

Description of Prior Art

With the advancement of technology, electronic products emerge one after another. The demand for electronic products is getting higher and higher, especially for electronic products with display screens, which puts forward the demand for larger display areas.

The prior art as shown in FIG. 1, a separate driving chip 202 is disposed in the lower border 201 of display panel 200. A flexible circuit board 203 is disposed below the driving chip 202, the driving chip 202 is connected with the driving chip 202 through the flexible circuit board 203, and the flexible circuit board 203 provides an external input signal for the driving chip 202. This structure makes the lower border 201 of display panel 200 longer, which affects a space of the display area.

SUMMARY OF INVENTION

The embodiments of the present application provide a display panel and display device, which capable of reducing the length of the lower border of the display panel, and increase the proportion of the display area.

The present application provides a display panel, comprising a display area and a non-display area, wherein the non-display area is located at a periphery of the display area, the non-display area comprises a first border and a second border disposed opposite to each other, a first driving chip and a second driving chip are disposed on the first border, the first driving chip and the second driving chip are disposed side by side, a flexible circuit board is disposed between the first driving chip and the second driving chip, and the flexible circuit board is electrically connected to the first driving chip and the second driving chip respectively.

In one exemplary embodiment, wherein the first driving chip comprises a first chip main body, first virtual pins, first input pins, and first output pins; the first virtual pins, the first input pins, and the first output pins are disposed on the first chip main body; the first input pins and the first output pins are disposed side by side; and the first virtual pins are disposed in parallel with the first input pins and the first output pins.

In one exemplary embodiment, wherein the first input pins comprise a first sub-plane input pin and a first sub-flexible circuit board input pin, the first sub-plane input pin is disposed on a left side of the first output pins, and the first sub-flexible circuit board input pin is disposed on the right side of the first output pins.

In one exemplary embodiment, wherein the second driving chip comprises a second chip main body, second virtual pins, second input pins and second output pins; the second virtual pins, the second input pins, and the second output pins are disposed on the second chip main body; the second input pins and the second output pins are disposed side by side; and the second virtual pins are disposed in parallel with the second input pins and the second output pins.

In one exemplary embodiment, wherein the second input pins comprise a second sub-plane input pin and a second sub-flexible circuit board input pin, the second sub-plane input pin is disposed on the right side of the second output pin, and the second sub-flexible circuit board input pin is disposed on the left side of the second output pin.

In one exemplary embodiment, wherein a flexible circuit board soldering pad is disposed on the first border between the first driving chip and the second driving chip, and the flexible circuit board is soldered to the flexible circuit board soldering pad.

In one exemplary embodiment, wherein the flexible circuit board comprises a first flexible circuit sub-board and a second flexible circuit sub-board, the first flexible circuit sub-board and the second flexible circuit sub-board are soldered side by side to the flexible circuit board soldering pad, the first flexible circuit sub-board is electrically connected to the first driving chip, and the second flexible circuit sub-board is electrically connected to the second driving chip.

In one exemplary embodiment, wherein a length of the first driving chip is same as a length of the second driving chip.

In one exemplary embodiment, wherein a number of the first virtual pins is equal to a sum of the first input pins and the first output pins.

In one exemplary embodiment, further comprising main driving chips, wherein each main driving chips comprise the first driving chip and the second driving chip, and a number of the main driving chips is greater than or equal to two.

The present application provides a display device comprising a display panel, wherein the display panel comprises a display area and a non-display area, wherein the non-display area is located at a periphery of the display area, the non-display area comprises a first border and a second border disposed opposite to each other, a first driving chip and a second driving chip are disposed on the first border, the first driving chip and the second driving chip are disposed side by side, a flexible circuit board is disposed between the first driving chip and the second driving chip, and the flexible circuit board is electrically connected to the first driving chip and the second driving chip respectively.

In one exemplary embodiment, wherein the first driving chip comprises a first chip main body, first virtual pins, first input pins, and first output pins; the first virtual pins, the first input pins, and the first output pins are disposed on the first chip main body; the first input pins and the first output pins are disposed side by side; and the first virtual pins are disposed in parallel with the first input pins and the first output pins.

In one exemplary embodiment, wherein the first input pins comprise a first sub-plane input pin and a first sub-flexible circuit board input pin, the first sub-plane input pin is disposed on a left side of the first output pins, and the first sub-flexible circuit board input pin is disposed on the right side of the first output pins.

In one exemplary embodiment, wherein the second driving chip comprises a second chip main body, second virtual pins, second input pins and second output pins; the second virtual pins, the second input pins, and the second output pins are disposed on the second chip main body; the second input pins and the second output pins are disposed side by side; and the second virtual pins are disposed in parallel with the second input pins and the second output pins.

In one exemplary embodiment, wherein the second input pins comprise a second sub-plane input pin and a second sub-flexible circuit board input pin, the second sub-plane input pin is disposed on the right side of the second output pin, and the second sub-flexible circuit board input pin is disposed on the left side of the second output pin.

In one exemplary embodiment, wherein a flexible circuit board soldering pad is disposed on the first border between the first driving chip and the second driving chip, and the flexible circuit board is soldered to the flexible circuit board soldering pad.

In one exemplary embodiment, wherein the flexible circuit board comprises a first flexible circuit sub-board and a second flexible circuit sub-board, the first flexible circuit sub-board and the second flexible circuit sub-board are soldered side by side to the flexible circuit board soldering pad, the first flexible circuit sub-board is electrically connected to the first driving chip, and the second flexible circuit sub-board is electrically connected to the second driving chip.

In one exemplary embodiment, wherein a length of the first driving chip is same as a length of the second driving chip.

In one exemplary embodiment, wherein a number of the first virtual pins is equal to a sum of the first input pins and the first output pins.

In one exemplary embodiment, further comprising main driving chips, wherein each main driving chip comprises the first driving chip and the second driving chip, and the number of the main driving chip is greater than or equal to two.

The embodiments of the present application provides a display panel and display device, display panel comprising a display area and a non-display area, the non-display area is located at a periphery of the display area, the non-display area comprises a first border and a second border disposed opposite to each other, a first driving chip and a second driving chip are disposed on the first border, the first driving chip and the second driving chip are disposed side by side, a flexible circuit board is disposed between the first driving chip and the second driving chip, and the flexible circuit board is electrically connected to the first driving chip and the second driving chip respectively. The present application is provided with two driving chips disposed side by side in the first border of the non-display area, and a flexible circuit board disposed between the two driving chips. Compared with the prior art, the longitudinal distance between the driving chip and the flexible circuit board on the display panel border can be reduced, so as to reduce the length of the lower border of the display panel and improve the proportion of the display area.

BRIEF DESCRIPTION OF DRAWINGS

In order to describe clearly the embodiments in the present application, the following will introduce the drawings for the embodiments shortly. Obviously, the following description is only a few embodiments of the present application, for the common technical personnel in the field it is easy to acquire some other drawings without creative work.

DETAILED DESCRIPTION OF EMBODIMENTS

Figure 1:
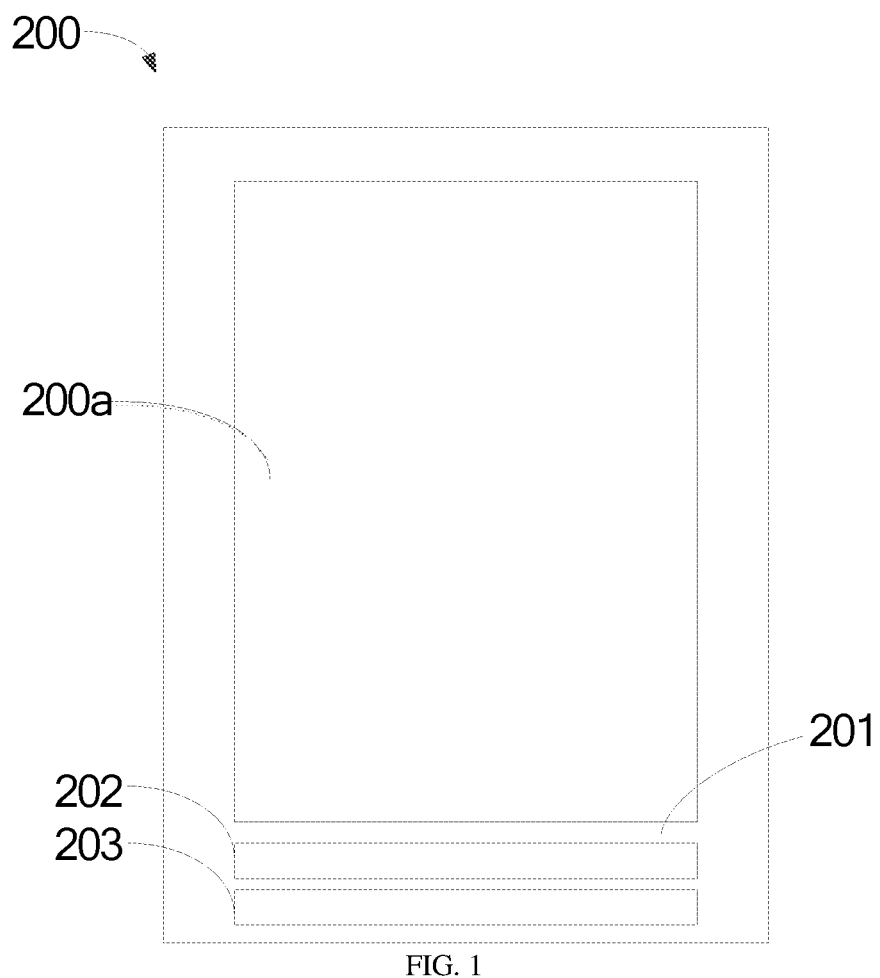
FIG. 1 is a schematic structural diagram of a display panel provided by the prior art.

The technical solutions of the present invention will be clearly and completely described below in conjunction with the accompanying drawings in the present invention. Obviously, the described embodiments are only a part of the embodiments of the present invention, rather than all the embodiments. Based on the embodiments of the present invention, all other embodiments obtained by those skilled in the art without creative work shall fall within the protection scope of the present invention.

It should be noted that in the description of the present invention, it should be understood that the terms "upper", "lower", "front", "back", "left", "right", "inside", "outside", etc. The indicated orientation or positional relationship is based on the orientation or positional relationship shown in the drawings, and is only for the convenience of describing the present invention and simplifying the description, rather than indicating or implying that the pointed device or element must have a specific orientation or a specific orientation. The structure and operation cannot therefore be understood as a limitation of the present invention.

The embodiments of the application provide a display panel and display device, the display panel in the embodiments of the application may be used in at least one of smartphones, tablet personal computers, mobile phones, video phones, e-book readers, desktop personal computers (desktop PCs), laptop PCs, netbook computers, workstations, servers, personal digital assistants, portable media players, MP3 players, mobile medical devices, cameras, game machines, digital cameras, car navigators, electronic billboards, automated teller machines, or wearable devices. The following is a detailed introduction to the display panel.

Figure 2:
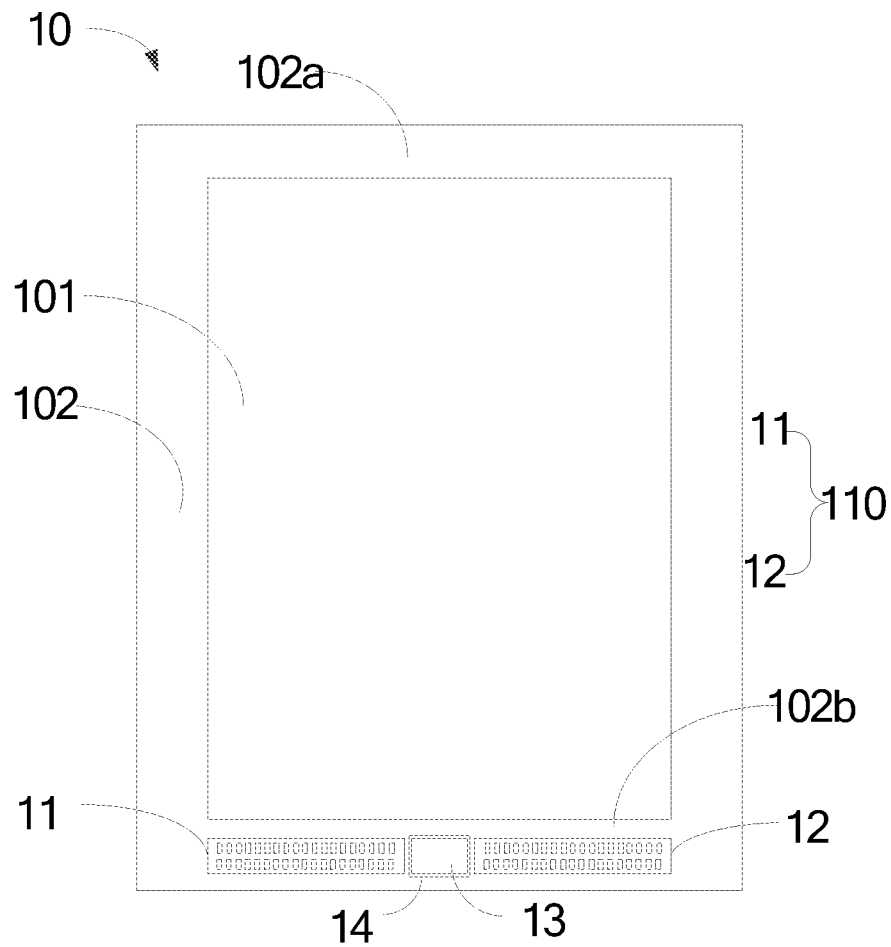
FIG. 2 is a schematic structural diagram of the display panel provided by the embodiments of the present application.

Please refer to FIG. 2. FIG. 2 is a schematic structural diagram of the display panel provided by the embodiments of the present application. Wherein, the display panel 10 comprises a display area 101 and a non-display area 102, wherein the non-display area 102 is located at a periphery of the display area 101, the non-display area 102 comprises a first border 102a and a second border 102b disposed opposite to each other, a first driving chip 11 and a second driving chip 12 are disposed on the first border 102a, the first driving chip 11 and the second driving chip 12 are disposed side by side, a flexible circuit board 13 is disposed between the first driving chip 11 and the second driving chip 12, and the flexible circuit board 13 is electrically connected to the first driving chip 11 and the second driving chip 12 respectively.

It should be noted that the display panel 10 comprises a display area 101 and a non-display area 102. The non-display area 102 is located at a periphery of the display area 101. The display area 101 is used for displaying a picture or for touch manipulation by the user, etc. The non-display area 102 is used for mounting sensors, wiring, etc. In addition, the first border 102a is the lower border of the non-display area 102. The second border 102b is the upper border of the non-display area 102. In some embodiments, the first border 102a may also be an upper border of the non-display area 102, and the second border 102b may be a lower border of the non-display area 102.

In addition, lengths of the first driving chip 11 and the second driving chip 12 in the embodiments of the present application are less than length of the driving chip in the prior art. The flexible circuit board 13 is electrically connected to the first driving chip 11 and the second driving chip 12 respectively, and the flexible circuit board 13 is capable of inputting external signals to the first driving chip 11 and the second driving chip 12.

In addition, the display panel 10 can be an active illuminant display panel 10, such as an organic light-emitting diode (OLED) display panel 10, an active-matrix organic light-emitting diode (AMOLED) display panel 10, a passive matrix organic light-emitting diode (PMOLED) display panel 10, a quantum dot light-emitting diodes (QLED) display panel 10, a micro light-emitting diode (micro-LED) display panel 10, or mini light-emitting diode (mini-LED) display panel 10, etc. The display panel 10 can also be a passive illuminant display panel 10, for example, a liquid crystal display (LCD) display panel.

Figure 3:
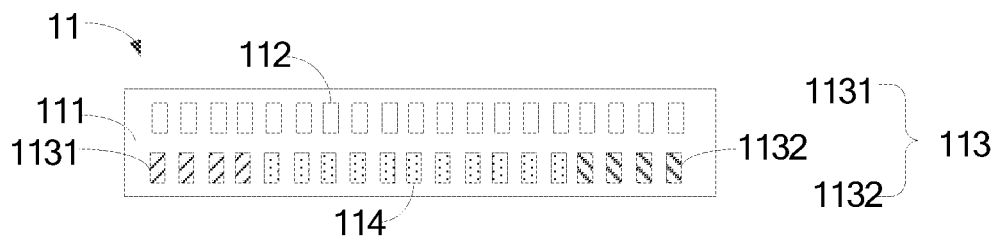
FIG. 3 is a schematic structural diagram of a first driving chip in the display panel provided by an embodiment of the application.

Please refer to FIG. 3. FIG. 3 is a schematic structural diagram of the first driving chip in the display panel provided by an embodiment of the application. Wherein, the first driving chip 11 comprises a first chip main body 111, first virtual pins 112, first input pins 113, and first output pins 114. The first virtual pins 112, the first input pins 113, and the first output pins 114 are disposed on the first chip main body 111, the first input pins 113 and the first output pins 114 are disposed side by side. The first virtual pins 112 are disposed in parallel with the first input pins 113 and the first output pins 114.

It should be noted that the shape of the first chip main body 111 can be a cuboid, a cube, or a cylinder, etc. The first virtual pins 112 mainly support the first driving chip 11. No signal input or output is in the first virtual pins 112. In addition, the external signal input to the first driving chip 11 can pass through the first input pins 113, and the first driving chip 11 can output the signal through the first output pins 114. It can be understood that the number of the first virtual pins 112, the first input pins 113, and the first output pins 114 is multiple. In the embodiments of the present application, the number of the first virtual pins 112, the first input pins 113 and the first output pins 114 are not specified. In the embodiments of the present application, the overall length of the first driving chip 11 is less than the overall length of the conventional driving chip. Therefore, the flexible circuit board 13 can be disposed between the first driving chip 11 and the second driving chip 12. The first driving chip 11 in this application can be closer to the edge of the display panel 10, further reducing the length of the lower border.

Wherein, the first input pins 113 comprise a first sub-plane input pin 1131 and a first sub-flexible circuit board input pin 1132. The first sub-plane input pin 1131 is disposed on a left side of the first output pins 114, and the first sub-flexible circuit board input pin 1132 is disposed on the right side of the first output pins 114.

It should be noted that the first sub-plane input pin 1131 mainly receives the feedback input signal of the first driving chip 11. The first sub-flexible circuit board input pin 1132 mainly receives the input signal of the flexible circuit board. Since the left side of the first driving chip 11 only receives the feedback signal of the first driving chip 11, the left side wiring of the first driving chip 11 takes up less space, which makes the left border take up less space. The input signal of the flexible circuit board is input from the right side to the first sub-flexible circuit board input pin 1132 so that the lower border takes up less space.

Figure 4:
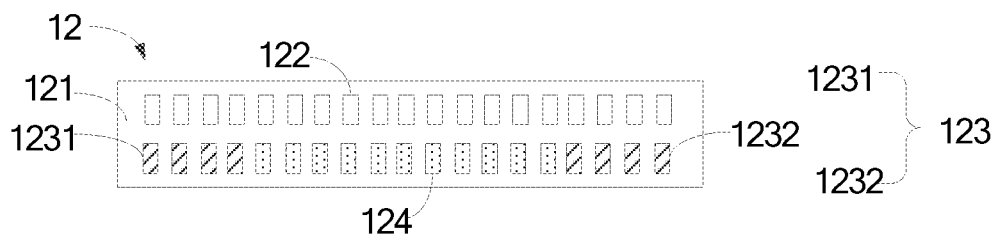
FIG. 4 is a schematic structural diagram of a second driving chip in the display panel provided by an embodiment of the application.

Please refer to FIG. 4. FIG. 4 is a schematic structural diagram of the second driving chip in the display panel provided by an embodiment of the application. Wherein, the second driving chip 12 comprises a second chip main body 121, second virtual pins 122, second input pins 123, and second output pins 124. The second virtual pins 122, the second input pins 123, and the second output pins 124 are disposed on the second chip main body 121. The second input pins 123 and the second output pins 124 are disposed side by side, and the second virtual pins 122 are disposed in parallel with the second input pins 123 and the second output pin 124.

It should be noted that the shape of the second chip main body 121 can be a cuboid, a cube, or a cylinder, etc. The second virtual pins 122 mainly supports the second driving chip 12. No signal input or output is in the second virtual pins 122. In addition, the external signal input to the second driving chip 12 can pass through the second input pins 123, and the second driving chip 12 can output the signal through the second output pins 124. It can be understood that each of the numbers of the second virtual pins 122, the second input pins 123, and the second output pins 124 is multiple. In the embodiments of the present application, the numbers of the second virtual pins 122, the second input pins 123, and the second output pins 124 are not specified. The overall length of the second driving chip 12 in the embodiments of the present application is smaller than the overall length of the conventional driving chip. Therefore, the second driving chip 12 in this application can be closer to the edge of the display panel 10, further reducing the length of the lower border.

Wherein, the second input pins 123 comprise a second sub-plane input pin 1231 and a second sub-flexible circuit board input pin 1232, the second sub-plane input pin 1231 is disposed on the right side of the second output pin 124, and the second sub-flexible circuit board input pin 1232 is disposed on the left side of the second output pin 124.

It should be noted that the second sub-plane input pin 1231 mainly receives the feedback input signal of the second driving chip 12. The second sub-flexible circuit board input pin 1232 mainly receives the input signal of the flexible circuit board 13. Since the left side of the second driving chip 12 only receives the feedback signal of the second driving chip 12. The right side wiring of the second driving chip 12 takes up less space, which makes the right border take up less space. The input signal of the flexible circuit board is input from the left side to the first sub-flexible circuit board input pin 1132 so that the lower border takes up less space.

Wherein, a flexible circuit board soldering pad 14 is disposed on the first border 102a between the first driving chip 11 and the second driving chip 12, and the flexible circuit board 13 is soldered to the flexible circuit board soldering pad 14.

Figure 5:
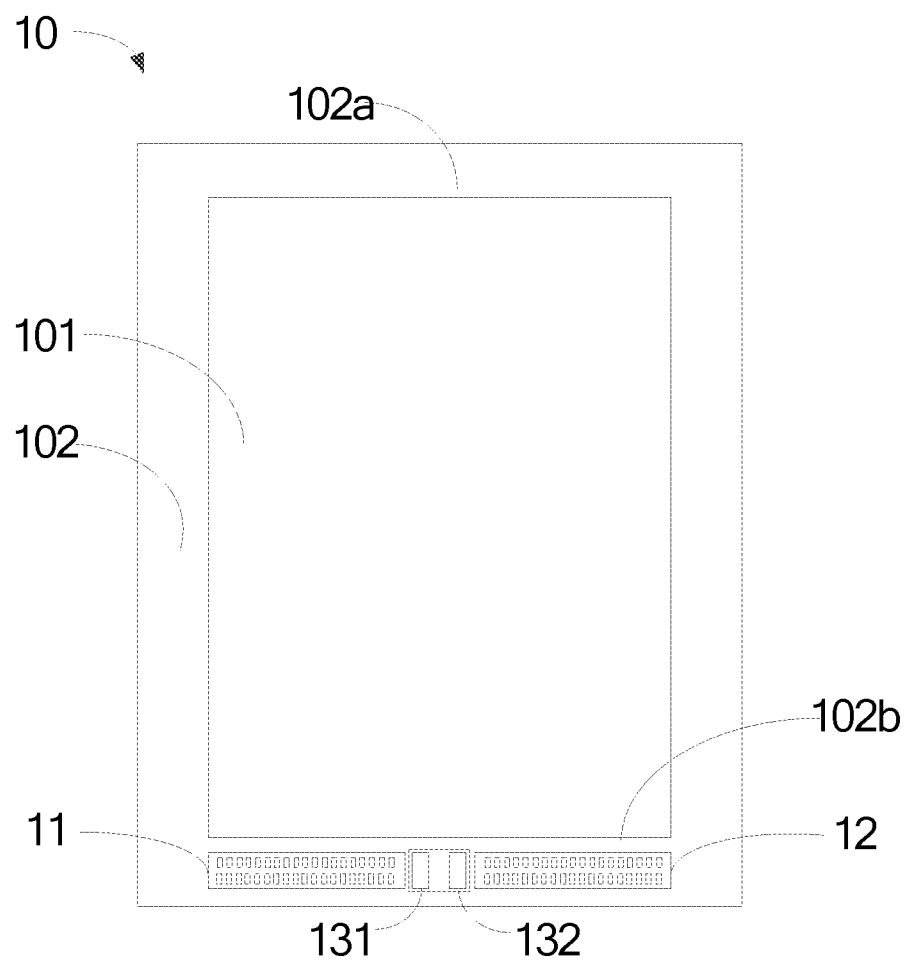
FIG. 5 is another schematic structural diagram of the display panel provided by the embodiments of the present application.

Please refer to FIG. 5. FIG. 5 is another schematic structural diagram of the display panel provided by the embodiments of the present application. Wherein, the flexible circuit board 13 comprises a first flexible circuit sub-board 131 and a second flexible circuit sub-board 132. The first flexible circuit sub-board 131 and the second flexible circuit sub-board 132 are soldered side by side to the flexible circuit board soldering pad 14, the first flexible circuit sub-board 131 is electrically connected to the first driving chip 11, and the second flexible circuit sub-board 132 is electrically connected to the second driving chip 12.

It can be understood that the first flexible circuit subboard 131 is electrically connected to the first driving chip 11, and the second flexible circuit sub-board 132 is electrically connected to the second driving chip 12, so that signals can be input to the first driving chip 11 and the second driving chip 12 respectively.

Wherein, a length of the first driving chip 11 is same as a length of the second driving chip 12. In some embodiments, the length of the first driving chip 11 and the second driving chip 12 may also be different Wherein, the number of the first virtual pins 112 is equal to a sum of the first input pins 113 and the first output pins 114. It can be understood that the number of the first virtual pins 112 is equal to a sum of the first input pins 113 and the first output pins 114, it is better to ensure that the first driving chip 11 can play a more even installation role during the installation. In addition, the number of the second virtual pins 122 is equal to a sum of the second input pins 123 and the second output pins 124.

Please continue to refer to FIG. 2, wherein the display panel 10 further comprises main driving chips 110, wherein each main driving chip 110 comprises the first driving chip 11 and the second driving chip 12, and the number of the main driving chips 110 is equal to or greater than two.

It can be understood that the total number of driving chips 110 can be two, three, or more.

The embodiments of the present application provide a display panel 10, the display panel 10 comprising a display area 101 and a non-display area 102, wherein the non-display area 102 is located at a periphery of the display area 101. The non-display area 102 comprises a first border 102a and a second border 102b disposed opposite to each other. A first driving chip 11 and a second driving chip 12 are disposed on the first border 102a. The first driving chip 11 and the second driving chip 12 are disposed side by side. A flexible circuit board 13 is disposed between the first driving chip 11 and the second driving chip 12, and the flexible circuit board 13 is electrically connected to the first driving chip 11 and the second driving chip 12 respectively. The present application is provided with two driving chips disposed side by side in the first border 102a of the non-display area 102. And a flexible circuit board 13 disposed between the two driving chips. Compared with the prior art, the longitudinal distance between the driving chips and the flexible circuit board 13 on the display panel 10 border can be reduced, so as to reduce the length of the lower border of the display panel 10 and improve the proportion of the display area 101.

Figure 6:
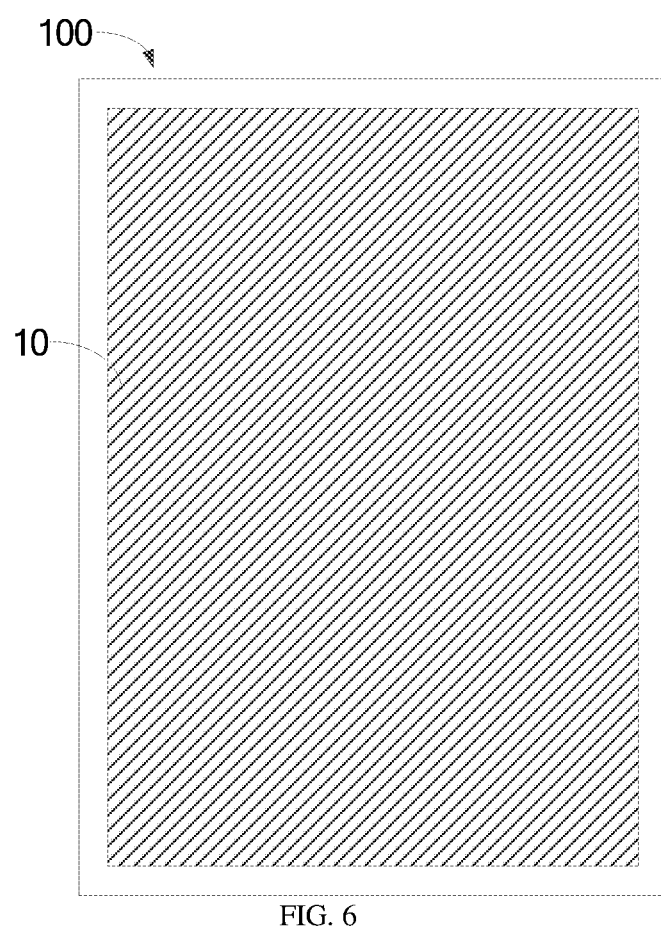
FIG. 6 is a schematic structural diagram of the display device provided by the embodiments of the present application.

Please refer to FIG. 6. FIG. 6 is a schematic structural diagram of the display device provided by the embodiments of the present application. The display device 100 provided in embodiments of the present application comprises display panel 10, which is the display panel 10 described above. The above embodiments have been described in detail for display panel 10, so in this embodiment of the present application, the display panel 10 is not covered at length.

It can be understood that the present application uses the display panel 10 in the above-mentioned embodiments, and since the display panel is provided with two driving chips disposed side by side in the first border of the non-display area, and a flexible circuit board is disposed between the two driving chips, when compared with the prior art, the longitudinal distance between the driving chips and the flexible circuit board on the display panel border can be reduced, so as to reduce the length of the lower border of the display panel and increase the space of the display area.

The above provides a detailed introduction to the display panel and the display device provided by the embodiments of present application. Specific examples are used in this article to illustrate the principle and implementation of the present application. The description of the above embodiments is only used to help understand the present application. At the same time, for those skilled in the art, according to the idea of the present application, there will be changes in the specific implementation and the scope of application. In summary, the content of this specification should not be construed as a limitation to the present application.

What is claimed is:

1. A display panel, comprising a display area and a non-display area, wherein the non-display area is located at a periphery of the display area, the non-display area comprises a first border and a second border disposed opposite to each other, a first driving chip and a second driving chip are disposed on the first border, the first driving chip and the second driving chip are disposed side by side in a direction where the first border extends, a flexible circuit board is disposed between the first driving chip and the second driving chip, the flexible circuit board is electrically connected to the first driving chip and the second driving chip respectively, the first driving chip is disposed on a left side of the flexible circuit board, and the second driving chip is disposed on a right side of the flexible circuit board, wherein the first driving chip comprises:

a first chip main body, and a first row of pins and a second row of pins disposed on the first chip main body, wherein the first row of pins and the second row of pins are opposite and parallel to each other, and comprise a same number of pins, wherein the first row of pins comprise a plurality of first virtual pins for supporting the first driving chip and transmitting no signal, and the second row of pins comprise a plurality of first input pins and a plurality of first output pins and do not comprise any virtual pin, the first input pins comprise a first in-plane input pin for receiving a feedback signal input to the first driving chip and a first flexible circuit board input pin for receiving an input signal from the flexible circuit board, the first in-plane input pin is disposed on a left side of the first output pins, and the first flexible circuit board input pin is disposed on a right side of the first output pins;

wherein the second driving chip comprises:

a second chip main body, and a first row of pins and a second row of pins disposed on the second chip main body, wherein the first row of pins and the second row of pins are opposite and parallel to each other, and comprise a same number of pins;

wherein the first row of pins of the second driving chip comprise a plurality of second virtual pins for supporting the second driving chip and transmitting no signal, and the second row of pins of the second driving chip comprise a plurality of second input pins and a plurality of second output pins and do not comprise any virtual pin, the second input pins comprise a second in-plane input pin for receiving a feedback signal input to the second driving chip and a second flexible circuit board input pin for receiving an input signal from the flexible circuit board, the second in-plane input pin is disposed on a right side of the plurality of second output pins, and the second flexible circuit board input pin is disposed on a left side of the plurality of the second output pins;

wherein the first flexible circuit board input pin is disposed on a side of the first driving chip closer to the flexible circuit board, and the second flexible circuit board input pin is disposed on a side of the second driving chip closer to the flexible circuit board;

wherein a flexible circuit board soldering pad is disposed on the first border between the first driving chip and the second driving chip, and the flexible circuit board is soldered to the flexible circuit board soldering pad;

wherein the flexible circuit board comprises a first flexible circuit sub-board and a second flexible circuit sub-board, and the first flexible circuit sub-board and the second flexible circuit sub-board are disposed side by side in the direction where the first border extends; the first flexible circuit sub-board is electrically connected to the first driving chip, and an orthogonal projection of the first flexible circuit sub-board in the non-display area does not overlap an orthogonal projection of the first driving chip in the non-display area; the second flexible circuit sub-board is electrically connected to the second driving chip, and an orthogonal projection of the second flexible circuit sub-board in the non-display area does not overlap an orthogonal projection of the second driving chip in the non-display area.

2. The display panel according to claim 1, wherein a length of the first driving chip is same as a length of the second driving chip.

3. The display panel according to claim 1, further comprising main driving chips, wherein each main driving chip comprises the first driving chip and the second driving chip, and a number of the main driving chips is greater than or equal to two.

4. A display device comprising a display panel, wherein the display panel comprises a display area and a non-display area, wherein the non-display area is located at a periphery of the display area, the non-display area comprises a first border and a second border disposed opposite to each other, a first driving chip and a second driving chip are disposed on the first border, the first driving chip and the second driving chip are disposed side by side in a direction where the first border extends, a flexible circuit board is disposed between the first driving chip and the second driving chip, the flexible circuit board is electrically connected to the first driving chip and the second driving chip respectively, the first driving chip is disposed on a left side of the flexible circuit board, and the second driving chip is disposed on a right side of the flexible circuit board, wherein the first driving chip comprises:
a first chip main body, and
a first row of pins and a second row of pins disposed on the first chip main body, wherein the first row of pins and the second row of pins are opposite and parallel to each other, and comprise a same number of pins,
wherein the first row of pins comprise a plurality of first virtual pins for supporting the first driving chip and transmitting no signal, and
the second row of pins comprise a plurality of first input pins and a plurality of first output pins and do not comprise any virtual pin, the first input pins comprise a first in-plane input pin for receiving a feedback signal input to the first driving chip and a first flexible circuit board input pin for receiving an input signal from the flexible circuit board, the first in-plane input pin is disposed on a left side of the first output pins, and the first flexible circuit board input pin is disposed on a right side of the first output pins;

wherein the second driving chip comprises:
a second chip main body, and
a first row of pins and a second row of pins disposed on the second chip main body, wherein the first row of pins and the second row of pins are opposite and parallel to each other, and comprise a same number of pins;
wherein the first row of pins of the second driving chip comprise a plurality of second virtual pins for supporting the second driving chip and transmitting no signal, and
the second row of pins of the second driving chip comprise a plurality of second input pins and a plurality of second output pins and do not comprise any virtual pin, the second input pins comprise a second in-plane input pin for receiving a feedback signal input to the second driving chip and a second flexible circuit board input pin for receiving an input signal from the flexible circuit board, the second in-plane input pin is disposed on a right side of the plurality of second output pins, and the second flexible circuit board input pin is disposed on a left side of the plurality of the second output pins;

wherein the first flexible circuit board input pin is disposed on a side of the first driving chip closer to the flexible circuit board, and the second flexible circuit board input pin is disposed on a side of the second driving chip closer to the flexible circuit board;

wherein a flexible circuit board soldering pad is disposed on the first border between the first driving chip and the second driving chip, and the flexible circuit board is soldered to the flexible circuit board soldering pad;

wherein the flexible circuit board comprises a first flexible circuit sub-board and a second flexible circuit sub-board, and the first flexible circuit sub-board and the second flexible circuit sub-board are disposed side by side in the direction where the first border extends; the first flexible circuit sub-board is electrically connected to the first driving chip, and an orthogonal projection of the first flexible circuit sub-board in the non-display area does not overlap an orthogonal projection of the first driving chip in the non-display area; the second flexible circuit sub-board is electrically connected to the second driving chip, and an orthogonal projection of the second flexible circuit sub-board in the non-display area does not overlap an orthogonal projection of the second driving chip in the non-display area.

5. The display device according to claim 4, wherein a length of the first driving chip is same as a length of the second driving chip.

6. The display device according to claim 4, further comprising main driving chips, wherein each main driving chip comprises the first driving chip and the second driving chip, and the number of the main driving chips is greater than or equal to two.

7. A display panel, comprising a display area and a non-display area, wherein the non-display area is located at a periphery of the display area, a first driving chip and a second driving chip are disposed on a first border of the non-display area, the first driving chip and the second driving chip are disposed side by side in a direction where the first border extends, a flexible circuit board is disposed between the first driving chip and the second driving chip, and the flexible circuit board is electrically connected to the first driving chip and the second driving chip, respectively;

wherein the first driving chip is disposed on a left side of the flexible circuit board, and the second driving chip is disposed on a right side of the flexible circuit board;

wherein the first driving chip comprises:

a first chip main body, and a first row of pins and a second row of pins disposed on the first chip main body, wherein the first row of pins and the second row of pins are opposite and parallel to each other, and comprise a same number of pins;

wherein the first row of pins comprise a plurality of first virtual pins for supporting the first driving chip; the second row of pins comprise a first in-plane input pin for receiving a feedback signal input to the first driving chip, a plurality of first output pins, and a first flexible circuit board input pin for receiving an input signal from the flexible circuit board; the first in-plane input pin is disposed on a left side of the first output pins, and the first flexible circuit board input pin is disposed on a right side of the first output pins;

wherein the second driving chip comprises:

a second chip main body, and a first row of pins and a second row of pins disposed on the second chip main body, wherein the first row of pins and the second row of pins are opposite and parallel to each other, and comprise a same number of pins;

wherein the first row of pins of the second driving chip comprise a plurality of second virtual pins for supporting the second driving chip; the second row of pins of the second driving chip comprise a second in-plane input pin for receiving a feedback signal input to the second driving chip, a plurality of second output pins, and a second flexible circuit board input pin for receiving an input signal from the flexible circuit board; the second in-plane input pin is disposed on a right side of the second output pins, and the second flexible circuit board input pin is disposed on a left side of the second output pins;

wherein the first flexible circuit board input pin is disposed on a side of the first driving chip closer to the flexible circuit board, and the second flexible circuit board input pin is disposed on a side of the second driving chip closer to the flexible circuit board.

* * * * *